(12) United States Patent
Wu

(10) Patent No.: US 10,788,919 B2
(45) Date of Patent: Sep. 29, 2020

(54) OPTICAL SENSING DEVICE, SEMICONDUCTOR DEVICE CONTAINING THE SAME, AND METHOD FOR DRIVING THE SAME

(71) Applicant: BOE TECHNOLOGY GROUP CO., LTD, Beijing (CN)

(72) Inventor: Chunwei Wu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 275 days.

(21) Appl. No.: 15/500,668

(22) PCT Filed: Aug. 15, 2016

(86) PCT No.: PCT/CN2016/095285
§ 371 (c)(1),
(2) Date: Jan. 31, 2017

(87) PCT Pub. No.: WO2017/032232
PCT Pub. Date: Mar. 2, 2017

(65) Prior Publication Data
US 2017/0220194 A1    Aug. 3, 2017

(30) Foreign Application Priority Data

Aug. 27, 2015  (CN) .......................... 2015 1 0535830

(51) Int. Cl.
*G06F 3/041*    (2006.01)
*G06F 3/042*    (2006.01)
(Continued)

(52) U.S. Cl.
CPC .......... *G06F 3/0416* (2013.01); *G02F 1/1343* (2013.01); *G02F 1/1368* (2013.01);
(Continued)

(58) Field of Classification Search
None
See application file for complete search history.

(56) References Cited

U.S. PATENT DOCUMENTS 6,947,102 B2    9/2005    Boer
8,334,853 B2   12/2012    Kim et al.
(Continued)

FOREIGN PATENT DOCUMENTS

CN      1658053 A      8/2005
CN    102004581 A      4/2011
(Continued)

OTHER PUBLICATIONS

State Intellectual Property Office of the P.R.C (SIPO) Office Action 1 for 201510535830.9 dated Aug. 28, 2017 16 Pages (including translation).

(Continued)

*Primary Examiner* — Stephen T. Reed
(74) *Attorney, Agent, or Firm* — Anova Law Group, PLLC

(57) ABSTRACT

The present disclosure provides an optical sensing device, including: a storage circuitry being coupled to a charging circuitry, a photosensitive circuitry, and a voltage-readout circuitry, the storage circuitry storing a voltage value; the charging circuitry being coupled to the storage circuitry for charging the storage circuitry; the photosensitive circuitry being connected to a first terminal for discharging the storage circuitry to the first terminal; and the voltage-readout circuitry being connected to the storage circuitry, for reading the voltage value of the storage circuitry.

16 Claims, 5 Drawing Sheets

(51) Int. Cl.
  *G02F 1/1333* (2006.01)
  *G02F 1/1343* (2006.01)
  *G02F 1/1345* (2006.01)
  *G02F 1/1368* (2006.01)
  *H01L 27/32* (2006.01)
  *H01L 31/113* (2006.01)
  *H03K 17/96* (2006.01)

(52) U.S. Cl.
  CPC ...... *G02F 1/13338* (2013.01); *G02F 1/13452* (2013.01); *G06F 3/042* (2013.01); *G06F 3/0418* (2013.01); *H01L 27/323* (2013.01); *H01L 27/3227* (2013.01); *H01L 31/1136* (2013.01); *H03K 17/9629* (2013.01); *H03K 2217/96015* (2013.01); *H03K 2217/96031* (2013.01)

(56) References Cited

U.S. PATENT DOCUMENTS

| | | | | |
|---|---|---|---|---|
| 2005/0134751 | A1* | 6/2005 | Abileah | G02F 1/13338 349/42 |
| 2009/0127432 | A1* | 5/2009 | Lee | G01J 1/32 250/205 |
| 2011/0157116 | A1* | 6/2011 | Shiraki | G09G 3/3648 345/207 |
| 2013/0002603 | A1 | 1/2013 | Tada | |
| 2014/0291640 | A1* | 10/2014 | Miyake | H01L 27/3262 257/40 |

FOREIGN PATENT DOCUMENTS

| | | |
|---|---|---|
| CN | 102360257 A | 2/2012 |
| CN | 103123554 A | 5/2013 |
| CN | 103488349 A | 1/2014 |
| CN | 103713433 A | 4/2014 |
| CN | 105044952 A | 11/2015 |
| JP | 2007140106 | 6/2007 |
| JP | 2010107415 | 5/2010 |

OTHER PUBLICATIONS

The World Intellectual Property Organization (WIPO) International Search Report for PCT/CN2016/095285 dated Nov. 10, 2016 p. 1-14.

* cited by examiner

OPTICAL SENSING DEVICE, SEMICONDUCTOR DEVICE CONTAINING THE SAME, AND METHOD FOR DRIVING THE SAME

CROSS-REFERENCES TO RELATED APPLICATIONS

This application is a national phase entry under 35 U.S.C. § 371 of International Application No. PCT/CN2016/095285, filed on Aug. 15, 2016, which claims priority to Chinese Patent Application No. 201510535830.9 filed on Aug. 27, 2015. The above enumerated patent applications are incorporated by reference herein in their entirety.

FIELD OF THE INVENTION

The present invention generally relates to the display technologies and, more particularly, relates to an optical sensing device, a semiconductor device semiconductor device containing the optical sensing device, and a method for driving the optical sensing device.

BACKGROUND

Liquid crystal displays (LCDs) and organic light-emitting diode (OLED) displays have advantages such as being light, thin, energy-efficient, providing displays of high brightness level and of high image quality. Thus, LCDs and OLED displays are often used in the screens of cell phones, televisions, computers, and other electronic devices. To ensure better human-computer interactions and to enable the users to operate electronic devices more directly, LCDs and OLED displays often include touch functions, i.e., the users can directly operate the electronic devices through touching the LCDs and the OLED displays using their fingers. A plurality of optical sensing devices is often integrated in an LCD or an OLED display of a device, and are used to detect intensities of light of the outside environment at different locations of the LCD or OLED display.

Often, a user uses a finger to touch the LCD or the OLED display, of an electronic device. The electronic device may use one or more optical sensing devices to detect intensities of light to determine the location of the touch point on the LCD or OLED display. The electronic device may also use the optical sensing devices to determine motions or movements of the finger.

In such a configuration, it is desirable for the optical sensing device to detect accurate light intensities of the outside environment at precise locations. It is also desirable the optical sensing device to determine motions or movements quickly so that the electronic device has a short response time to touch motions.

BRIEF SUMMARY OF THE DISCLOSURE

The present disclosure provides an optical sensing device and a method for driving the optical sensing device. The disclosed optical sensing device may have improved detection accuracy and shorter response time to touch motions.

One aspect of the present disclosure includes an optical sensing device, including: a storage circuitry coupled to a charging circuitry, a photosensitive circuitry, and a voltage-readout circuitry, the storage circuitry storing a voltage value; the charging circuitry being coupled to the storage circuitry for charging the storage circuitry; the photosensitive circuitry being connected to a first terminal for discharging the storage circuitry to the first terminal; and the voltage-readout circuitry being connected to the storage circuitry, for reading the voltage value of the storage circuitry.

Optionally, the photosensitive circuitry includes a photosensitive thin film transistor (TFT). The photosensitive TFT T1 comprises a first electrode connected to the first terminal, a second electrode connected to the storage circuitry, and a control electrode being grounded.

Optionally, the storage circuitry includes a capacitor. The capacitor comprises a first terminal being grounded and a second terminal being coupled to the second electrode of the photosensitive circuitry.

Optionally, the voltage-readout circuitry includes an operational amplifier. The operational amplifier includes an inverting input terminal connected to the storage circuitry, a non-inverting input terminal connected to a second terminal, and an output terminal connected to an output terminal of the voltage-readout circuitry.

Optionally, the voltage-readout circuitry further includes a second TFT. The second TFT includes a first electrode connected to the second terminal of the capacitor, a second electrode connected to an inverting input terminal of the operational amplifier, and a control electrode connected to a first pulse signal input line.

Optionally, the output terminal of the voltage-readout circuitry is connected to an external readout device.

Optionally, the charging circuitry includes a third TFT. The third TFT includes a first electrode connected to the second electrode of the second TFT, a second electrode connected to the output terminal of the operational amplifier, and a control electrode connected to a second pulse signal input line.

Optionally, the second TFT receives a first signal from the first pulse signal input line to connect the second TFT to the operational amplifier and the storage circuitry, the voltage value of the storage circuitry being amplified and outputted to the output terminal of the voltage-readout circuitry.

Optionally, the third TFT receives a first signal from the second pulse signal input line so that the third TFT charges the storage circuitry to a first voltage value through the second TFT.

Optionally, the charging circuitry comprises a fourth TFT, wherein the fourth TFT has a first electrode connected to a voltage terminal, a second electrode connected to the photosensitive circuitry, and a control electrode connected to a second pulse signal input line.

Optionally, the photosensitive circuitry comprises a photosensitive TFT T1. The photosensitive TFT T1 has a first electrode connected to the second electrode of the fourth TFT, a second electrode connected to the storage circuitry, and a control electrode connected to a second pulse signal input line.

Optionally, the photosensitive circuitry further includes a fifth TFT between photosensitive TFT T1 and the first terminal. The fifth TFT has a first electrode connected to the first terminal, a second electrode connected to the first electrode of the photosensitive TFT T1 and the second electrode of the fourth TFT, and a control electrode connected to the second pulse signal input line.

Optionally, the fourth TFT is N-type transistor, and the fifth TFT is P-type transistor.

Optionally, the photosensitive TFT T1 is made of a photosensitive material, the photosensitive material including one or more of single-crystal silicon, poly-crystal silicon, amorphous silicon, and oxide.

Another aspect of the present disclosure provides a semiconductor device, including a disclosed optical sensing device.

Optionally the semiconductor device includes a control circuitry connected to an output terminal of the voltage-readout circuitry, wherein based on the voltage value of the storage circuitry, the control circuitry determines a location, and a movement of a touch point on a liquid-crystal display or an organic light-emitting diode display.

Another aspect of the present disclosure provides a method for driving the optical sensing device according to any disclosed optical sensing device, including: charging the storage circuitry to a first voltage value; discharging a leakage current wider light illumination so that electric charges in the storage circuitry drain through the photosensitive circuitry to the first terminal such that the storage circuitry has a second voltage value; determining the second voltage value; and calculating a light intensity of the light illumination based on a difference between a voltage on the first terminal and the second voltage value of the storage circuitry.

Optionally, based on the difference between the first voltage value and the voltage of the storage circuitry, the voltage-readout circuitry determines a value of the leakage current and the light intensity of the light illumination at a location of the optical sensing device.

Optionally, a duration for the voltage-readout circuitry to determine the voltage of the storage circuitry and a light intensity of an outside environment is shorter than a duration for the electric charges in the storage circuitry to drain through.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

For those skilled in the art to better understand the technical solution of the invention, reference will now be made in detail to exemplary embodiments of the invention, which are illustrated in the accompanying drawings. Wherever possible, the same reference numbers will be used throughout the drawings to refer to the same or like parts.

Figure 8:
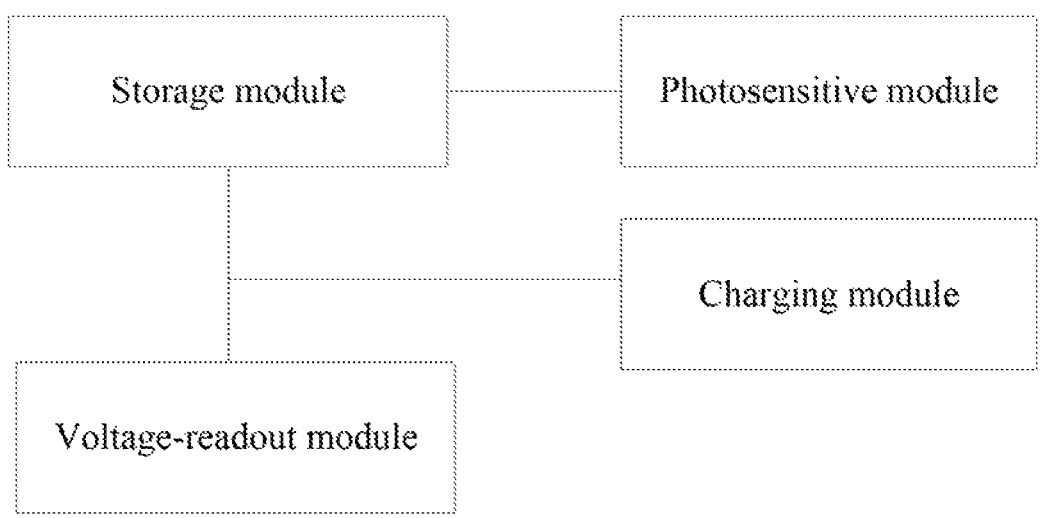
FIG. 8 illustrates an exemplary block diagram of an optical sensing device.

A LCD or OLED display panel may use one or more optical sensing devices to sense touch points and touch motions. An optical sensing device may include a photosensitive circuitry, a voltage-readout circuitry, a storage circuitry, and a charging circuitry, as shown in FIG. 8. The storage circuitry may be connected to or coupled to the photosensitive circuitry and the voltage-readout circuitry. The photosensitive circuitry may be connected to or coupled to the storage circuitry. The charging circuitry may be connected to or coupled to the storage circuitry and the voltage-readout circuitry. The voltage-readout circuitry may be connected to or coupled to the storage circuitry and the charging circuitry. The photosensitive circuitry may be connected to a terminal, e.g., ground or a power supply. The voltage of the power supply may be kept to be higher than the voltage on the storage circuitry. The photosensitive circuitry may sense light and generate leakage current so that electric charges from the power supply is transported to the storage circuitry. The storage circuitry may store the voltage on the storage circuitry. The voltage on the storage circuitry may then increase so that the light intensity at the location where the photosensitive circuitry locates can be determined based on the increase of voltage on the storage circuitry.

In some embodiments, the photosensitive circuitry may include a photosensitive thin film transistor (TFT), the storage circuitry may include a capacitor, the reading circuitry may include a reading TFT, and the voltage-readout circuitry may include a voltage-readout circuit. For illustrative purposes, in FIGS. 1, 3, and 5 of the present disclosure, the photosensitive circuitry may be shown as a photosensitive TFT T1, the storage circuitry may be shown as a capacitor Cs, the reading circuitry may be shown as a reading TFT T2, and the voltage-readout circuitry may be shown as a voltage-readout circuit B, i.e., an operational amplifier. In some embodiments, the reading TFT T2 may be included in the voltage-readout circuit. In some embodiments, the reading TFT T2 may not be included in the optical sensing device. It should be noted that, the specific means or structures to implement the functions of the aforementioned circuitries should be determined according to different applications and designs, and should not be limited by the embodiments of the present disclosure.

Because the light intensity varies, the leakage current generated by the photosensitive circuitry may vary. When a finger touches the LCD or the OLED display, the light intensity at the touch point decreases because of the blocking of light at the touch point. The leakage current generated by the photosensitive circuitry at the touch point decreases. Thus, by comparing different light intensities from outside environment detected by all the optical sensing devices on the LCD or the OLED display, the location of the touch point may be determined. The electronic device can also determine the movement of the finger at the touch point based on whether the location of the touch point changes continuously.

Often, residual electric charges often exist in the storage circuitry of the optical sensing device. Thus, in the touch detection process, an electronic device, e.g., an LCD, may not be able to detect the accurate amount of residual electric charges in the storage circuitry.

In the present disclosure, an optical sensing device may include a photosensitive circuitry, a storage circuitry, a voltage-readout circuitry, and a charging circuitry. When a finger or a conductive stylus is approaching or touching an LCD or an OLED display, the finger may block the light illuminating on a photosensitive circuitry. The photosensitive circuitry, being blocked by the finger, may have lower/ decreased leakage current. The photosensitive circuitry, with a decreased leakage current less than a preset value, may be located at or within the touch point.

In embodiments of the present disclosure, before the optical sensing device starts to detect the light intensity of the outside environment, the charging circuitry may be used to charge the storage circuitry to a preset voltage value, so that the voltage on the storage circuitry is known when the detection of the light intensity of the outside environment starts. The leakage current generated by the photosensitive circuitry under light illumination from outside environment may be calculated based on the difference between the preset voltage value and the voltage on the storage circuitry, read by the voltage-readout circuitry. The calculation of light intensities at different locations of the LCD or the OLED display in one period may be performed. By comparing the light intensity at each location on the LCD or the OLED display, detected by all the optical sensing devices on the LCD or the OLED display, the touch point may be determined. The movement of the touch motion may be determined by detecting the changes of locations of the touch point.

For example, if the touch motion on the LCD or the OLED display is sliding, a plurality of touch points may be formed by the sliding motion. The leakage current of photosensitive circuitry corresponding to the touch points may sequentially be lower than the preset value along the continuous track, which corresponds to the sliding motion on the LCD or OLED display. That is, the LCD or the OLED display may respond to the touch motion based on the changes of locations of the touch point and the operations corresponding to the locations.

Figure 1:
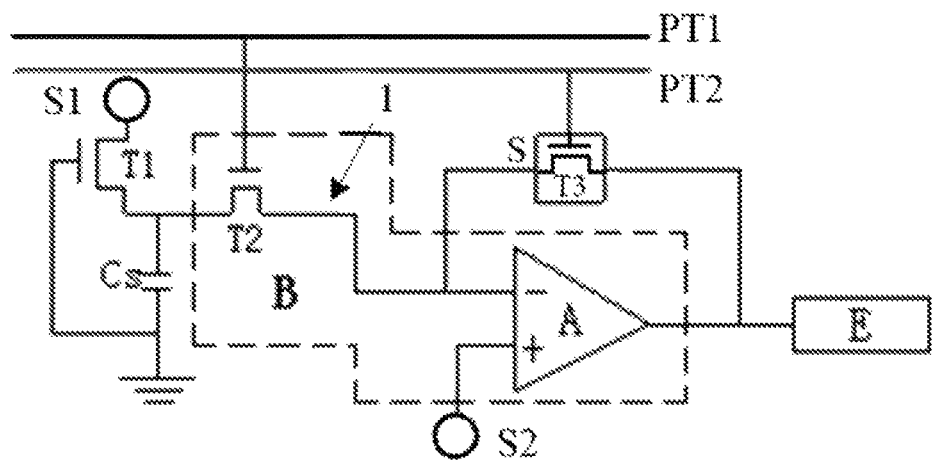
FIG. 1 illustrates an exemplary optical sensing device according to the disclosed embodiments of the present disclosure.

One aspect of the present disclosure provides an optical sensing device. As shown in FIG. 1, the optical sensing device may include a photosensitive circuitry, a storage circuitry, a voltage-readout circuitry, and a charging circuitry. The charging circuitry may refer to the switching device S in FIG. 1 and the third power supply S3 in FIG. 3.

The first electrode of the photosensitive circuitry may be connected to a first power supply S1. The third electrode or control electrode of the photosensitive circuitry may be grounded. The storage circuitry may be connected between the control electrode and the second electrode of the photosensitive circuitry. One terminal of the storage circuitry may be coupled to the control electrode of the photosensitive circuitry, and the other terminal of the stowage circuitry may be coupled to the second electrode of the photosensitive circuitry. The charging circuitry may charge the storage circuitry such that the voltage on the storage circuit may be higher than the voltage provided by the first power supply S1. Further, electric charges may drain through the photosensitive TFT T1 such that the voltage on the storage circuit may be equal to the voltage provided by the first power supply S1.

The input terminal of the voltage-readout circuitry may be connected to the second electrode of the photosensitive circuitry. In some embodiments, the output terminal of the voltage-readout circuitry E may be connected to an external readout circuitry E. The charging circuitry, i.e., the switching device S in FIG. 1 or the third power supply S3 in FIG. 3, may be connected to the storage circuitry. The external readout circuitry E may include any suitable device or circuitry for reading out the voltage on the storage circuitry. In some other embodiments, no external readout circuitry E may be included in the optical sensing device.

Before the optical sensing device detects the light intensity of the outside environment, the charging circuitry may be used to charge the storage circuitry so that the voltage on the storage circuitry is charged to a preset voltage value or a first voltage value. After the voltage on the storage circuitry has been charged to the preset voltage value, leakage current generated by the photosensitive circuitry under light illumination from the outside environment may result the electric charges in the storage circuitry to gradually decrease or drain through the photosensitive circuitry. After the photosensitive circuitry keeps leaking current for a certain period of time, the electric charges in the storage circuitry flow to the external readout circuitry E through the voltage-readout circuitry. The external readout circuitry E may obtain the voltage on the storage circuitry through the amount of electric charges flowing from the storage circuitry. The external readout circuitry E may further calculate the light intensity of the outside environment at the location of the photosensitive circuitry based on the amount of electric charges flowing from the storage circuitry.

Specifically, before the LCD or OLED display detects the light intensity of the outside environment, the charging circuitry may be used to charge the storage circuitry to the preset voltage value so that the voltage on the storage circuitry is known when the LCD or OLED display starts the detection of the light intensity of outside environment. The value of the leakage current, generated by the photosensitive circuitry under light illumination of the outside environment, may be calculated. The calculation of the leakage current may be based on the difference between the preset voltage value and the actual voltage on the storage circuitry, where the actual voltage on the storage circuitry is the voltage on the storage circuitry after the leakage current has been flowing for a certain period of time. The voltage on the storage circuitry may be read out by the external readout circuitry E. The external readout circuitry E may be integrated with or connected to a control circuitry of the LCD or OLED display, and the light intensity of the outside environment may be determined based on a correlation between light intensity and intensity of the leakage current, as obtained by the external readout circuitry E or the control circuitry. The correlation may be stored in the external readout circuitry E or the control circuitry. The calculation result of one period may be used to determine the light intensity of the outside environment at the location of each photosensitive circuitry on the LCD or the OLED display.

By comparing the light intensity at each location, detected by each optical sensing device on the LCD or the OLED display, the touch point may be determined. The movement of the finger or conductive stylus at the touch point may be determined by detecting the changes of locations of the touch point. It may be faster to detect the touch point with higher accuracy. Failure rate in determining the touch point may be reduced. The response to the touch motion may be faster.

The optical sensing device provided by the present disclosure may be used in touch technologies and other various technologies, such as fingerprint recognition functions and dimming of monitors.

In the present disclosure, when a finger or a conductive stylus is approaching or touching an LCD or an OLED display, the finger may block the light illuminating on a photosensitive circuitry. The photosensitive circuitry, being blocked by the finger, may have lower/decreased leakage current. The photosensitive circuitry, with a decreased leakage current less than a preset value, may be located at or within the touch point. If the touch motion on the LCD or the OLED display is clicking, the leakage current of photosensitive circuitry at or within the touch point of the LCD or the OLED display would not be lower than the preset value after the clicking motion. The LCD or the OLED display may respond to the clicking motion based on the location of the touch motion and the operations corresponding to the location. If the touch motion on the LCD or the OLED display is sliding, a plurality of touch points may be formed by the sliding motion, where the touch points may form a continuous track on the LCD or the OLED display. The leakage current of photosensitive circuitry corresponding to the touch points may sequentially be lower than the preset value along the continuous track, which corresponds to the sliding motion on the LCD or OLED display. That is, the LCD or the OLED display may respond to the touch motion based on the changes of locations of the touch point and the operations corresponding to the locations.

In some embodiments, the light intensity of the outside environment may not be sufficiently high for the leakage current of the photosensitive circuitry to be sufficiently different with and without a touch motion. In this case, the LCD or the OLED display may be used as the backlight and light reflection caused by a touch motion on the screen of the LCD or the OLED display may be detected. Because of the light reflection, the leakage current detected by the optical sensing device at or within the touch point may be stronger. The working mechanism of the optical sensing device when the backlight and reflection are used to determine the touch point may be similar to the working mechanism without the backlight, except that a higher leakage current is detected by the optical sensing device at the touch point. Details are not repeated herein.

In the present disclosure, when the potential at the first electrode of the photosensitive circuitry is higher than the potential at the second electrode of the photosensitive circuitry, the photosensitive circuitry may be turned on. When the potential at the first electrode of the photosensitive circuitry is lower than the potential at the second electrode of the photosensitive circuitry, the photosensitive circuitry may be turned off. Because of photosensitivity, when turned off, the photosensitive circuitry would not be turned off completely under light illumination from the outside environment. Leakage current may be generated by the photosensitive circuitry. Because the voltage provided by the first power supply S1 is lower than the voltage on the storage circuitry, the electric charges in the storage circuitry may gradually drain through the photosensitive circuitry. As the light intensity of the outside environment varies, the value of the leakage current generated by the photosensitive circuitry may be different. Specifically, a higher light intensity from the outside environment corresponds to a higher leakage current of the photosensitive circuitry.

Figure 2:
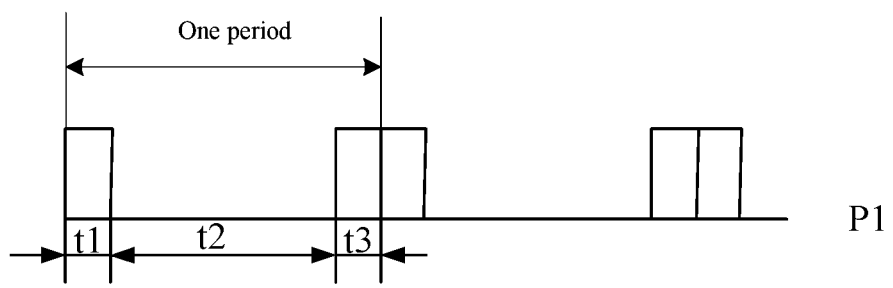
FIG. 2 illustrates an exemplary timing diagram of the first pulse signal P1 and the second pulse signal P2 according to the embodiments of the present disclosure.
Figure 2:
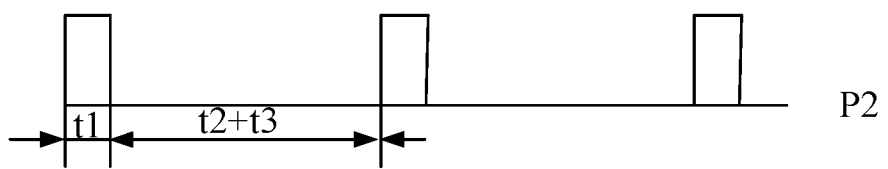
Figure 4:
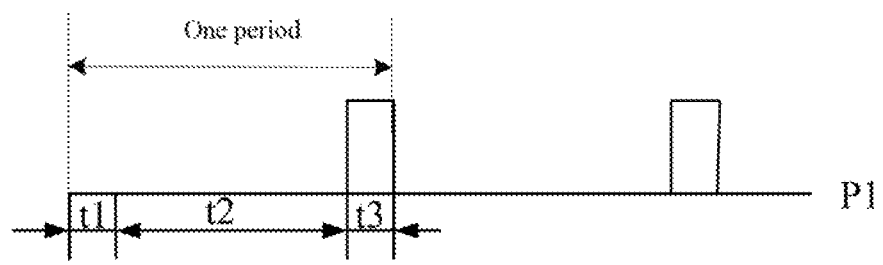
FIG. 4 illustrates another exemplary timing diagram of the first pulse signal P1 and the second pulse signal P2 according to the embodiments of the present disclosure.
Figure 4:
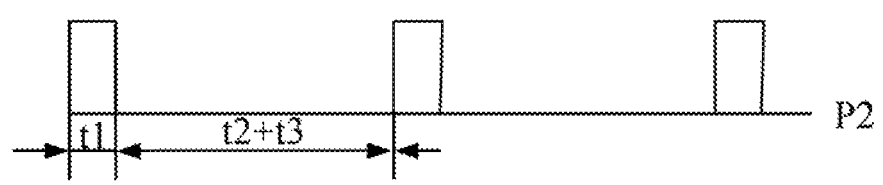

In the embodiments of the present disclosure, for the optical sensing device to detect the light intensity of the outside environment with improved real-time performance and higher accuracy, the detection process of an optical sensing device is operated in periods. The ending point of an earlier period overlaps with the starting point of a later period, as shown in FIGS. 2 and 4. In each period, the operation of the optical sensing device may include phases t1-t3. In the first phase t1, the charging circuitry may be used to charge the storage circuitry to the preset voltage value. In the second phase t2, the photosensitive circuitry may generate leakage current under light intensity from the outside environment so that the electric charges in the storage circuitry may drain through the photosensitive circuitry. In the third phase t3, the electric charges in the storage circuitry may flow to the external readout circuitry E through the voltage-readout circuitry. The external readout circuitry E may obtain the voltage on the storage circuitry and calculate the light intensity of the outside environment based on the amount of electric charges flowing to the external readout circuitry E. The operation of the optical sensing device may be controlled by the first pulse signals P1 inputted by the first pulse signal input line PT1 and the second pulse signals P2 inputted by the second pulse signal input line PT2. Functions of the pulse signals will be described more combining the components of the optical sensing device in this disclosure.

As shown in FIG. 1, in the present disclosure, in some embodiments, the voltage-readout circuitry may include a reading circuitry and an operational amplifier A. The reading circuitry may include a reading TFT T2. In some other embodiment, the voltage-readout circuitry may include only an operational amplifier A.

The first electrode of the reading circuitry may be connected to the second electrode of the photosensitive circuitry. The control electrode or third electrode of the reading circuitry may be connected to the first pulse signal input line PT1. The first pulse signal input line PT1 may input signals, i.e., first pulse signals P1. A timing diagram of the pulse signals inputted by the first pulse signal input line PT1 may be shown in FIGS. 2 and 4.

As shown in FIG. 1, in same embodiments, the voltage-readout circuitry may include a reading circuitry and an operational amplifier A. In this case, the non-inverting input terminal of the operational amplifier A may be connected to the second power supply S2. The second power supply S2 may be a voltage terminal or ground. The inverting input terminal of the operational amplifier A may be connected to the second electrode of the reading circuitry or the second electrode of the storage circuitry through a readout line 1. The output terminal of the operational amplifier A may be connected to the external readout circuitry E. In some other embodiments, the voltage-readout circuit may only include an operational amplifier A. In this case, the non-inverting input terminal of the operational amplifier A may be connected to the second power supply S2, and the inverting input terminal of the operational amplifier A may be connected to the second terminal of the photosensitive circuitry or the second electrode of the storage circuitry through the readout line 1.

After the photosensitive circuitry keeps leaking current for a certain period of time, the third electrode of the reading circuitry may receive a high-level signal from the first pulse signal input line PT1. The reading, circuitry may be connected to the operational amplifier A, and the photosensitive circuitry. The voltage on the storage circuitry may be amplified and outputted to the external readout circuitry E.

In the present disclosure, because the leakage current flowing through the circuit is sufficiently small when the photosensitive circuitry is leaking current, it may require a sufficiently long duration for the voltage or voltage drop on the storage circuitry to be detected by the external readout circuitry E. Meanwhile, the duration for the external readout circuitry E to detect the voltage on the storage circuitry may be much shorter than the duration for the leakage current to build, up the voltage drop on the storage circuitry. That is, in one period, as indicated in FIGS. 2 and 4, the phase or duration of the high-level signal inputted by the first pulse signal input line PT1, t3, may be much shorter than the phase of the low-level signal inputted by the first pulse signal input line PT1, t2. In some embodiments, the duration of the phase of the high-level signals inputted by the first pulse signal input line PT1, t3, may be 1/1000 of the duration of the phase of the low-level signals inputted by the first pulse signal input line PT1, t2.

By using the pulse signals inputted by the first pulse signal input line PT1 to control the disclosed optical sensing device for reading out the voltage on the storage circuitry, the control and operation of the optical sensing device may be easier. The result of the reading operation may be more accurate.

As shown in FIG. 1, in the present disclosure, the charging circuitry may be the switching device S. The switching device S may be connected in parallel with the operational amplifier A, and arranged between the output terminal of the operational amplifier A and the second electrode of the reading circuitry. In some embodiments, the switching device S may also be connected to a second pulse signal input line PT2 so that the switching device S may be controlled by the signals inputted by the second pulse signal input line PT2 to be switched on or off. The signals inputted by the second pulse signal input line PT2 may be referred to as the second pulse signal P2.

In some embodiments, the charging circuitry S may include a third TFT T3. The third TFT T3 may include a first electrode connected to the second electrode of the reading circuitry, a second electrode connected to the output terminal of the operational amplifier A, and a control electrode or third electrode connected to a second pulse signal input line. In some embodiments, the second electrode of the third TFT T3 may also be connected to the second pulse signal input line PT2.

In the present disclosure, the high-level signals and the low-level signals are only for illustrative purposes. A high-level signal in the first pulse signal P1/second pulse signal P2 may also be referred to as a first signal, and a low-level signal in the first pulse signal P1/second pulse signal P2 may also be referred to as a second signal. The first signal and the second signal are used for controlling particular states of the components in the circuit and should not be limited to a certain type of signal. The "first" and the "second" are only for illustrative purposes and do not infer any order or differences in functions of the signals. The choices of high-level signals or low-level signals may be determined according to different applications or designs, e.g., different types of TFTs, and should not be limited by the embodiments disclosed in the present disclosure.

Before the optical sensing device detects the light intensity of the outside environment, the switching device S may be switched on. Meanwhile, the reading circuitry may receive the high-level signal inputted by the first pulse signal input line PT1. The reading circuitry may be turned on. The reading circuitry may be configured to connect the storage circuitry with the switching device S.

In some embodiments, the output current of the external readout circuitry E may flow into the storage circuitry through the switching device S and the reading circuitry to charge the storage circuitry.

In the present disclosure, the external readout circuitry E may be connected to the output terminal of the operational amplifier A through a suitable interface/port, such as a USB port. When the switching device S is open switched off, i.e., the second pulse signal input line PT2 inputting a low-level signal, the reading circuitry may be connected to the external readout circuitry E through the operational amplifier A. The output terminal of the operational amplifier A may output electric signals to the external readout circuitry E through the port, so that telecommunication signals transmitted by the reading circuitry may be amplified by the operational amplifier A and sent to the external readout circuitry E. That is, the external readout circuitry E may be used to read out the electric signals.

When the switching device S is switched on/closed, i.e., the second pulse signal input line PT2 inputting a low-level signal, the operational amplifier A may be shorted. The maximum voltage on the storage circuitry is the preset voltage value, and the preset voltage value is often sufficiently low, e.g., often lower than 5 V. The voltage on the external readout circuitry E is often higher than the preset voltage value. Thus, when the operational amplifier A is shorted by the switching device S, the external readout circuitry E may input electric current to the switching device S through the port. That is, the external readout circuitry E may be used to charge the storage circuitry. In the present disclosure, when the voltage on the storage circuitry reaches the preset voltage value, the switching device S may be switched off.

In some embodiments, the switching device S may be connected to a second pulse signal input line PT2. FIG. 2 shows an exemplary timing diagram of the pulse signals provided by the first pulse signal input line PT1 and the second pulse signal input line PT2.

As shown in FIG. 2, before the optical sensing device starts to detect the light intensity of the outside environment, the switching device S may receive a high-level signal inputted by the second pulse signal input line PT2 so that the switching device S may be controlled to be turned on. Thus, the detection of light intensity of the outside environment may be operated in periods.

The switching device S may be one or more of a switching diode, a TFT, and a mechanical switch. In some embodiments, the switching device S may be a TFT.

The photosensitive circuitry may be turned off or stay in "OFF" state during the operation. When under light of certain intensity from the outside environment, the photosensitive circuitry may keep leaking electric current. When the first pulse signal input line PT1 inputs a high-level signal and the switching device S is switched on, the external readout circuitry E may charge the storage circuitry, shown in the phase t1 in FIG. 2. When the storage circuitry reaches the preset voltage value, the increase in the voltage on the storage circuitry resulted by the charging of the external readout circuitry E, may be equal to the decrease in the voltage on the storage circuitry caused by the leaking of current through the photosensitive circuitry. Thus, the decrease or drop on the voltage on the storage circuitry may be accurately determined.

Figure 3:
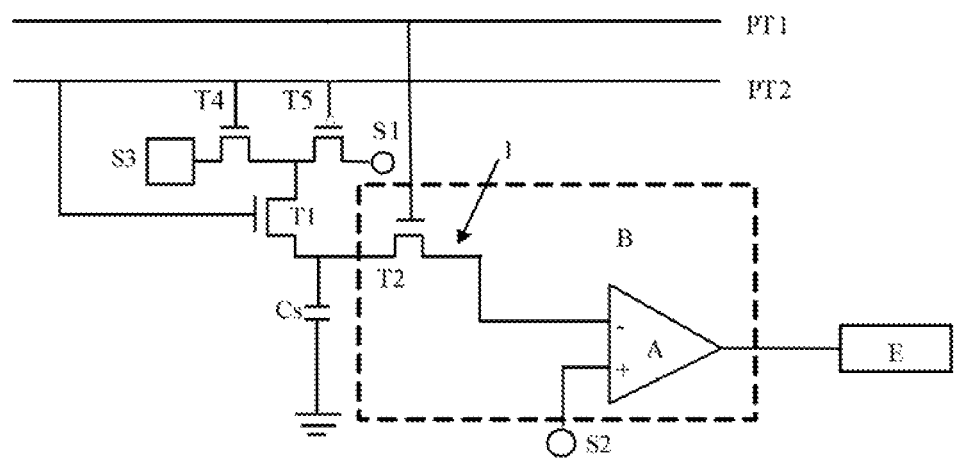
FIG. 3 illustrates another exemplary optical sensing device according to the disclosed embodiments of the present disclosure.

As shown in FIG. 3, in the present disclosure, as a variation, the charging circuitry may also be a third power supply S3. The voltage provided by the third power supply S3 may be higher than the voltage on the storage circuitry. The third power supply S3 may be connected to the first electrode of the photosensitive circuitry. The control electrode of the photosensitive circuitry may be connected to the second pulse signal input line PT2.

As shown in FIG. 3, the charging circuitry may further include a fourth TFT. The fourth TFT T4 may include a first electrode connected to the third power supply S3, a second electrode connected to the photosensitive circuitry, and a control electrode or third electrode connected to a second pulse signal input line PT2. The third power supply S3 may be a voltage terminal or ground. The photosensitive circuitry may include a photosensitive TFT T1. The photosensitive TFT T1 may include a first electrode connected to the second electrode of the fourth TFT T4, a second electrode connected to the storage circuitry, and a control electrode connected to the second pulse signal input line PT2.

In some embodiments, the photosensitive circuitry may further include a fifth TFT T5 between photosensitive TFT T1 and the first power supply S1. The fifth TFT may include a first electrode connected to the first power supply S1, a second electrode connected to the first electrode of the photosensitive TFT T1 and the second electrode of the fourth TFT T4, and a control electrode connected to the second pulse signal input line PT2.

In some embodiments, the fourth TFT T4 may be an N-type transistor, and the fifth TFT T5 may be a P-type transistor. The fourth TFT T4 may be turned on by applying a high voltage-level signal on the control electrode, and the fifth TFT T5 may be turned on by applying a low voltage-level signal on the control electrode. The specific types of transistors used in the embodiments are only exemplary and should not limit the scope of the present disclosure.

FIG. 4 shows another exemplary timing diagram of the pulse signals inputted by the first pulse signal input line PT1 and the second pulse signal input line PT2. When the second pulse signal input line PT2 inputs a high-level signal, the third power supply S3 may be connected to the photosensitive circuitry, and the first power supply S1 may be disconnected from the photosensitive circuitry. The third power supply S3 may start charging the storage circuitry through the photosensitive circuitry.

In some embodiments, a switching device may be connected between the photosensitive circuitry and the first power supply S1. In some embodiments, another switching device may be connected between the photosensitive circuitry and the third power supply S3. Depending on the applications, the switching device between the photosensitive circuitry and the first power supply S1 may be a P-type TFT, and the switching device between the photosensitive circuitry and the third power supply S3 may be an N-type TFT. For viewing simplicity, the described switching devices are not shown in FIG. 3. The specific types of devices used as the switching devices should be according to different applications and designs and should not be limited by the embodiments of the present disclosure.

When the second pulse signal input line PT2 inputs a low-level signal, the third power supply S3 may be disconnected front the photosensitive circuitry, and the first power supply S1 may be connected to the photosensitive circuitry.

In the present disclosure, when the third power supply S3 is disconnected from the photosensitive circuitry and the first power supply S1 is connected to the photosensitive circuitry, because the voltage on the storage circuitry is higher than the voltage provided by the first power supply S1, the photosensitive circuitry may be turned off and may keep leaking current so that the voltage on the storage circuitry may be decreased. When the third power supply S3 is connected to the photosensitive circuitry and the first power supply S1 is disconnected from the photosensitive circuitry, because the voltage on the storage circuitry may be lower than the voltage provided by the third power supply S3, the photosensitive circuitry may be turned on. The third power supply S3 may be used to charge the storage circuitry so that the voltage on the storage circuitry may reach the preset voltage value.

Because polarized capacitors often have small volumes and large capacitances, in the present disclosure, the storage circuitry may be a polarized capacitor. The volume of the disclosed optical sensing device may be reduced and the capacitance of the storage circuitry may be desirably large.

The photosensitive circuitry may be made of a suitable photosensitive material. For example, the photosensitive circuitry may be made of one or more of single-crystal silicon, poly-crystal silicon, amorphous silicon, and oxide. In some embodiments, the photosensitive circuitry may be made of single-crystal silicon.

Another aspect of the present disclosure provides a semiconductor device. The semiconductor device may include a plurality of the disclosed optical sensing devices described above. The optical sensing devices may be integrated in the semiconductor device. In some embodiments, the semiconductor device may be a semiconductor device.

Figure 5:
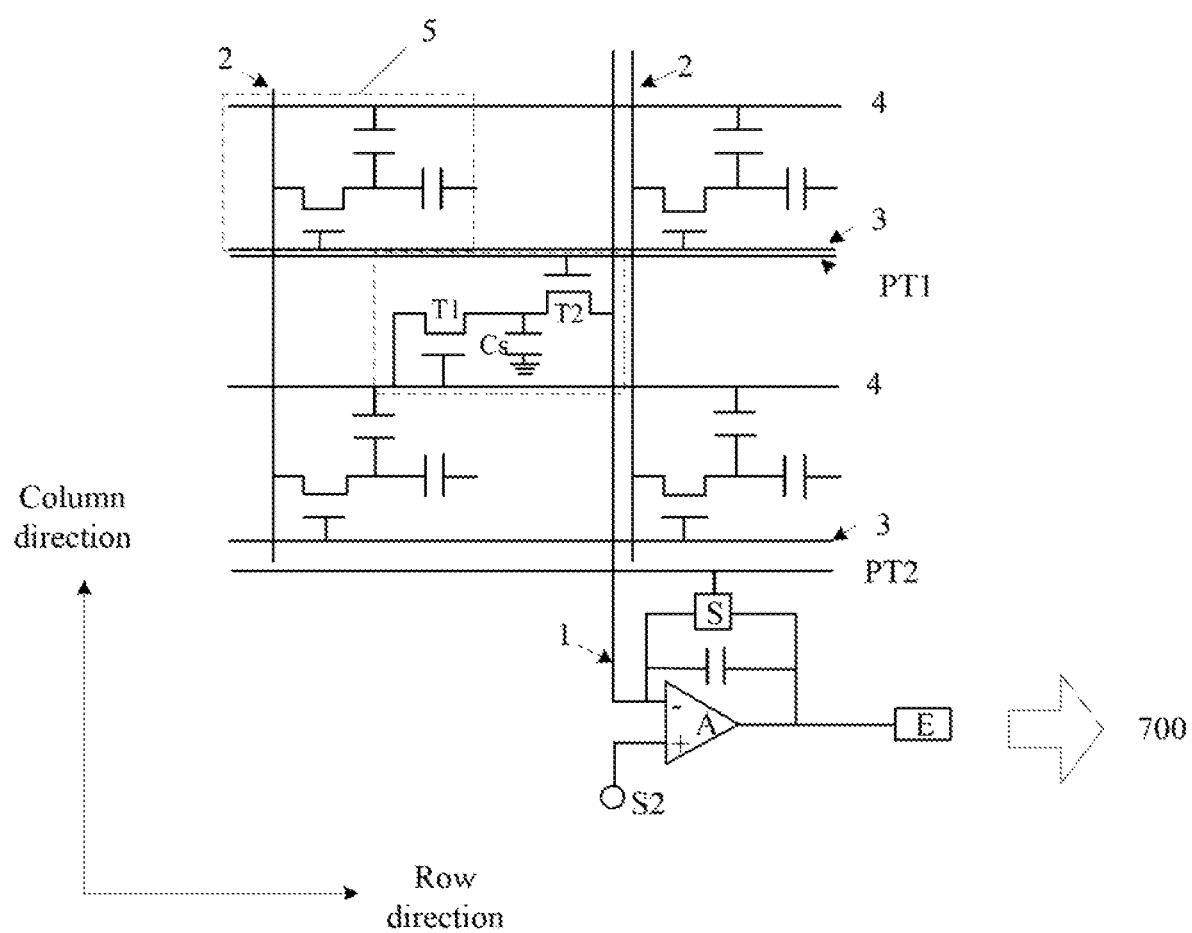
FIG. 5 illustrates another exemplary optical sensing device and related circuitry according to the embodiments of the present disclosure.

As shown in FIG. 5, the optical sensing devices may be arranged repeatedly, e.g., in arrays, on the LCD or the OLED display of the semiconductor device. For illustrative purposes, only one optical sensing device is shown. In FIG. 5, the dash line rectangle in the center include a photosensitive circuitry, a storage circuitry, and a reading circuitry of an optical sensing device described above. Four pixel TFT units 5 are arranged to surround the optical sensing device. The optical sensing devices in the LCD or OLED display may be fabricated through the same fabrication steps with the pixel TFT units. It should be noted that, the structure shown in FIG. 5 is only exemplary. In practice, the number of pixel TFT units 5 surrounding one optical sensing device and the number of optical sensing devices in the LCD or OLED display should be determined or adjusted according to different applications and designs, and should not be limited by the embodiments disclosed in the present disclosure.

As shown in FIG. 5, the pixel TFT units 5 in one row, along the row direction, may be connected to a driving line 4 and a gate line 3. The driving line 4 may also be referred as a common voltage line, providing a common voltage to the components in the LCD or OLED display. The pixel TFT units 5 in one column, along the column direction, may be connected to a data line 2. In each period, the gate line 3 may be used to select or turn on one row of pixel TFT units, and the data lines 2 may be used to input data signals into the selected row of pixel TFT units.

Different from the line connections illustrated in FIGS. 1 and 3, in FIG. 5, the first electrode and the control electrode of the photosensitive circuitry, and one terminal of the storage circuitry may be connected to the driving line 4 of the semiconductor device. The common voltage may provide a low-level signal, e.g., lower than 5 voltages or the ground signal, to keep the photosensitive circuitry in off state so that leakage current may flow through the circuit. The optical sensing device may be connected to a control circuitry of the semiconductor device through the external readout circuitry E. The control circuitry may implement various functions based on the light intensity through the detection result obtained by the external readout circuitry E. For example, the control circuitry may implement touch functions, fingerprint recognition functions, and/or dimming functions.

In an LCD or an OLED display, the plurality of optical sensing devices may be arranged in arrays. Optical sensing devices in one row or in one column may share one switching device S, one operational amplifier A, and one external readout circuitry E. The operation of the rows of optical sensing devices may correspond to the scanning of the pixel TFT units. For example, in one period, the gate line 3 may select a row of pixel TFT units 5, and the data lines 2 may input data signals into the selected row of pixel TFT units 5. Meanwhile, the row of optical sensing devices corresponding to the selected row of pixel TFT units 5 may each start detecting light intensity of the outside environment. That is, in each period, each operational amplifier A and each external readout circuitry E may only be used to calculate the light intensity of one optical sensing device in the corresponding column. Further, rows of the optical sensing devices on the LCD or the OLED display may each be scanned in a similar manner and light intensity across the entire LCD of the OLED display may be detected.

The specific operation of an optical sensing device in each period may refer to the description in relation to FIGS. 1 and 3, and are not repeated herein.

According to the present disclosure, before the optical sensing device starts to detect the light intensity of the outside environment, the charging circuitry may be used to charge the storage circuitry to a preset voltage value, so that the voltage on the storage circuitry is known when the detection of the light intensity of the outside environment starts. The leakage current generated by the photosensitive circuitry under light intensity from outside environment may be calculated based on the difference between the preset voltage value and the voltage on the storage circuitry, read by the external readout circuitry E. The calculation of light intensities at different locations of the LCD or the OLED display in one period may be performed. By comparing the light intensity at each location on the LCD or the OLED display, detected by all the optical sensing devices on the LCD or the OLEO display, the touch point may be determined. The movement of the touch motion may be determined by detecting the changes of locations of the touch point. The touch point may be detected with improved speed and accuracy. Touch failure may be avoided. Response to the touch motion may be faster.

Figure 7:
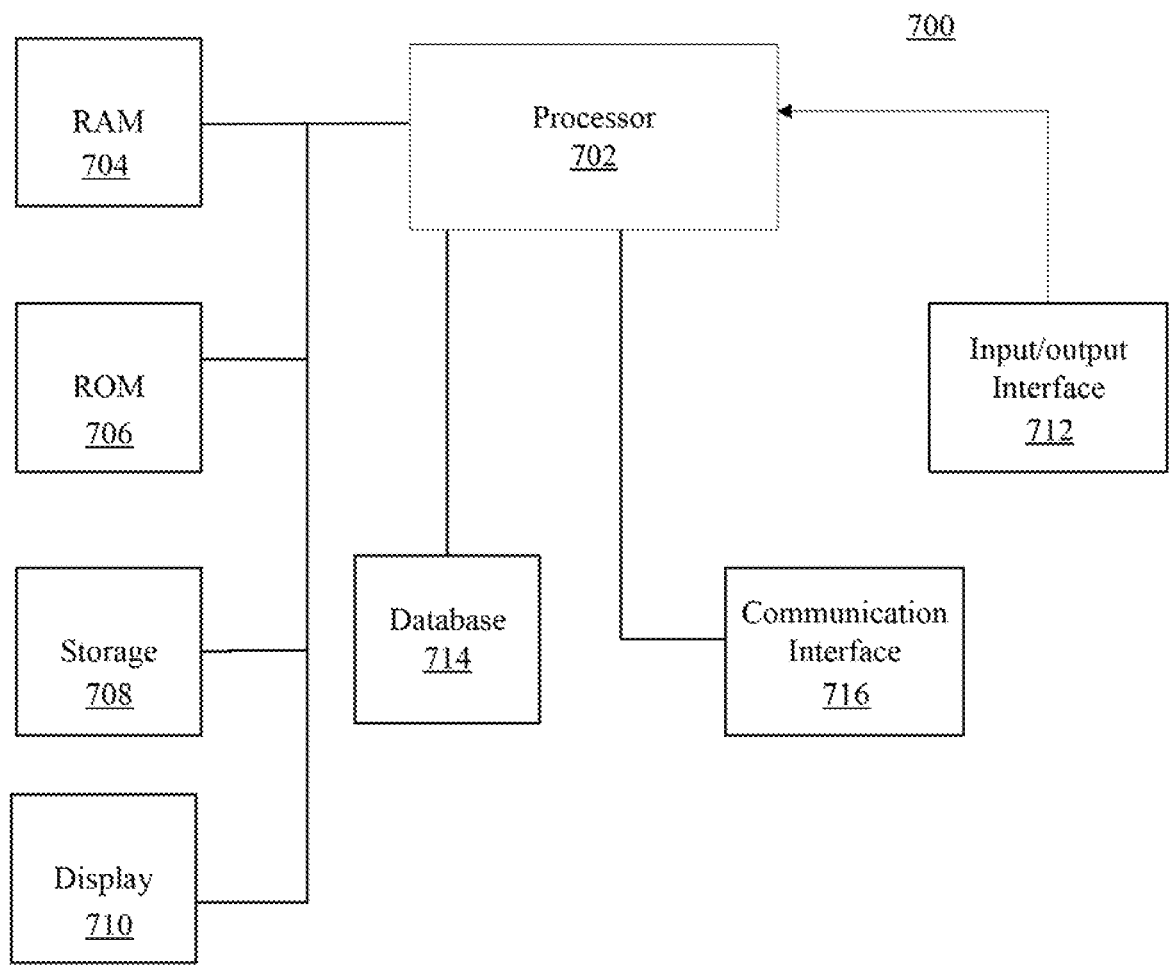
FIG. 7 illustrates an exemplary block diagram of the control circuitry used in the present disclosure.

FIG. 7 illustrates the block diagram of an exemplary control circuitry 700 used in the semiconductor device.

The control circuitry 700 may receive, process, and execute commands from the semiconductor device. The control circuitry 700 may include any appropriately configured computer system. As shown in FIG. 7, the control circuitry 700 may include a processor 702, a random access memory (RAM) 704, a read-only memory (ROM) 706, a storage 708, a display 710, an input/output interface 712, a database 714; and a communication interface 716. Other components may be added and certain devices may be removed without departing from the principles of the disclosed embodiments.

Processor 702 may include any appropriate type of general-purpose microprocessor, digital signal processor or microcontroller, and application specific integrated circuit (ASIC). Processor 702 may execute sequences of computer program instructions to perform various processes associated with the control circuitry 700. Computer program instructions may be loaded into RAM 704 for execution by processor 702 front read-only memory 706, or from storage 708. Storage 708 may include any appropriate type of mass storage provided to store any type of information that processor 702 may need to perform the processes. For example, storage 708 may include one or more hard disk devices, optical disk devices, flash disks, or other storage devices to provide storage space.

Display 710 may provide information to a user or users of the control circuitry 700. Display 710 may include any appropriate type of computer display device or electronic device display (e.g., CRT or LCD based devices). Input/output interface 712 may be provided for users to input information into the control circuitry 700 or for the users to receive information from the control circuitry 700. For example, input/output interface 712 may include any appropriate input device, such as a keyboard, a mouse, an electronic tablet, voice communication devices, touch screens, or any other optical or wireless input devices. Further, input/output interface 712 may receive from and/or send to other external devices.

Further, database 714 may include any type of commercial or customized database, and may also include analysis tools for analyzing the information in the databases. Database 714 may be used for storing any suitable information for the calculation, control, and operation of the LCD or the OLED display, e.g., information for calculating light intensity based on leakage current. Communication interface 716 may provide communication connections such that control circuitry 700 may be accessed remotely and/or communicate with other systems through computer networks or other communication networks via various communication protocols, such as transmission control protocol/internet protocol (TCP/IP), hyper text transfer protocol (HTTP), etc.

In one embodiment, a user may input commands on the input/output interface 712 to start detecting the light intensities of the outside environment at different locations on the LCD or the OLED display. The processor 702 may receive, process, and execute the commands to obtain data from the data line. The control circuitry 700 may determine the light intensities at the location of each optical sensing device and compare the light intensity of each location to obtain the touch point and movement of the touch motion. The control circuitry 700 may also respond to the touch motion based on the data collected from the data line. Suitable data may be stored in ROM 706 and storage 708 to be processed. After the data is processed, the control circuitry 700 may respond to the touch motion.

Figure 6:
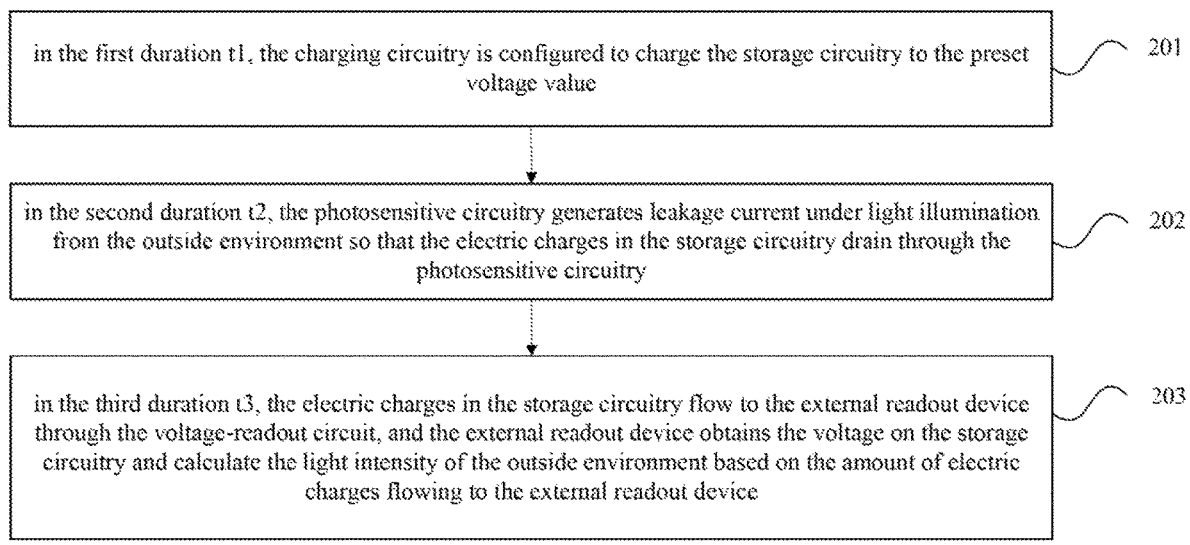
FIG. 6 illustrates a block diagram of an exemplary driving method for driving the optical sensing device provided by the present disclosure.

Referring back to FIG. 6, the present disclosure further provides a method for driving the optical sensing device. The method may be used to drive any one of the disclosed optical sensing devices. In one period, the method may include steps 201 to 203.

In step 201, in the first phase t1, the charging circuitry may be used to charge the storage circuitry to the preset voltage value.

In step 202, in the second phase t2, the photosensitive circuitry may generate leakage current under light illumination from the outside environment so that the electric charges in the storage circuitry may drain through the photosensitive circuitry.

In step 203, in the third phase t3, the electric charges in the storage circuitry may flow to the external readout circuitry through the voltage-readout circuitry. The external readout circuitry may obtain the voltage on the storage circuitry and determine the light intensity of the outside environment based on the amount of electric charges flowing to the external readout circuitry.

For example, when the optical sensing device has a structure shown in FIG. 1, the timing diagram of the signals inputted by the first pulse signal input line PT1 and the second pulse signal input line PT2 may be as shown in FIG. 2. In this case, the charging circuitry is the switching device S, and one period may be divided to three phases, i.e., t1, t2, and t3. In phase t1, the first pulse signal input line PT1 and the second pulse signal input line PT2 may both input a high-level signal. The reading circuitry and the switching device S may both be turned on so that the external readout circuitry E may charge the storage circuitry to the preset voltage value. In phase t2, the first pulse signal input line PT1 and the second pulse signal input line PT2 may both input a low-level signal. The switching device S and the reading circuitry may both be turned off. The photosensitive circuitry may keep generating leakage current and electric charges in the storage circuitry may drain through the photosensitive circuitry. In phase t3, the first pulse signal input line PT1 may input a high-level signal and the second pulse signal input line PT2 may input a low-level signal. The switching device S may be turned off and the reading circuitry may be turned on. Electric charges in the storage circuitry may flow through the voltage-readout circuitry to the external readout circuitry E. The external readout circuitry E may determine the voltage on the storage circuitry and further calculate the light intensity of the outside environment.

When the optical sensing device has a structure shown in FIG. 3, the timing diagram of the pulse signals inputted by the first pulse signal input line PT1 and the second pulse signal input line PT2 may be as shown in FIG. 4. Different from the optical sensing device shown in FIG. 2, and the optical sensing device shown in FIG. 3 includes a third power supply S3 as the charging circuitry. The third power supply S3 may be connected to the first electrode of the photosensitive circuitry. The voltage provided by the third power supply S3 is higher than the voltage on the storage circuitry. In the first period, the first pulse signal input line PT1 may input a low-level signal. Because the voltage provided by the third power supply S3 is higher than the voltage on the storage circuitry, in phase t1, the second pulse signal input line PT2 inputs a high-level signal, the third power supply S3 may be connected to the photosensitive circuitry, and the first power supply S1 may be disconnected from the photosensitive circuitry. The third power supply S3 may start charging the storage circuitry through the photosensitive circuitry. The operations of phases t2 and t3 in one period may be similar to optical sensing device and the related timing diagram in FIGS. 1 and 2, and are not repeated herein.

Details of the operations in each period may be referred to the description related FIGS. 1 and 3, and are not repeated herein.

As shown in FIGS. 2 and 4, for the first pulse signal input line PT1, the duration of phases t3, i.e., the duration of the high-level signal for the external readout circuitry E to obtain the voltage on the storage circuitry, may be much shorter than the duration of phase t2, i.e., the duration of a low level signal for the leakage current to build up the voltage drop on the storage circuitry. Specifically, the duration of phase t3 may be about 1/1000 of the duration of phase t2. That is, the duration for the external readout circuitry E to obtain the voltage on the storage circuitry and the light intensity from the outside environment may be much shorter than the duration for the electric charges of the storage circuitry to drain through the photosensitive circuitry. It should be noted that, the objects in the figures of the present disclosure are for illustrative purposes only, and do not reflect the actual lengths and ratios of the objects.

According to the present disclosure, before the optical sensing device starts to detect the light intensity of the outside environment, the charging circuitry may be used to charge the storage circuitry to a preset voltage value, so that the voltage on the storage circuitry is known when the detection of the light intensity of the outside environment starts. The leakage current generated by the photosensitive circuitry under light intensity from outside environment may be calculated based on the difference between the preset voltage value and the voltage on the storage circuitry, read by the external readout circuitry E. The calculation of light intensities at different locations of the LCD or the OLED display in one period may be calculated. By comparing the light intensity at each location on the LCD or the OLED display, detected by all the optical sensing devices on the LCD or the OLED display, the touch point may be determined. The movement of the touch motion may be determined by detecting the changes of locations of the touch point. The touch point may be detected with improved speed and accuracy. Touch failure may be avoided. Response to the touch motion may be faster.

It should be understood that the above embodiments disclosed herein are exemplary only and not limiting the scope of this disclosure. Without departing from the spirit and scope of this invention, other modifications, equivalents, or improvements to the disclosed embodiments are obvious to those skilled in the art and are intended to be encompassed within the scope of the present disclosure.

What is claimed is:

1. An optical sensing device, comprising:
a storage circuitry, a charging circuitry, a photosensitive circuitry including a first terminal and a second terminal, and a voltage-readout circuitry, wherein:
the photosensitive circuitry is connected to the storage circuitry at the second terminal, and the photosensitive circuitry is connected to the voltage-readout circuitry at the second terminal;
the storage circuitry is charged during a first time interval and discharged during a second time interval;
during the first time interval, the charging circuitry is switched on and electrically connected to the storage circuitry via a thin film transistor (TFT) of the voltage-readout circuitry, and the charging circuitry is charging the storage circuitry to a first voltage value, the TFT being switched on during the first time interval;
during the second time interval, the charging circuitry is switched off, and the photosensitive circuitry is discharging the storage circuitry to a second voltage value in response to light illumination and to a potential of the first terminal being less than a potential of the second terminal, the second time interval being after the first time interval; and
during a third time interval, the charging circuitry is switched off, and the voltage-readout circuitry is electrically connected to the storage circuitry, for reading the second voltage value of the storage circuitry with respect to the first voltage value, the third time interval being after the first time interval and the second time interval;
the storage circuitry comprising a capacitor, wherein the capacitor comprises a first terminal being grounded and a second terminal being coupled to the second terminal of the photosensitive circuitry;
the voltage-readout circuitry comprising an operational amplifier;
wherein the TFT is a second TFT and the voltage-readout circuitry includes the second TFT, wherein the second TFT comprises:
a first electrode connected to the second terminal of the capacitor, a second electrode connected to the inverting input terminal of the operational amplifier, and a control electrode connected to a first pulse signal input line;
the charging circuitry comprising a third TFT, wherein:
the third TFT comprises a first electrode connected to the second electrode of the second TFT, a second electrode connected to the output terminal of the operational amplifier, and a control electrode connected to a second pulse signal input line.

2. The optical sensing device according to claim 1, the photosensitive circuitry comprising a photosensitive thin film transistor (TFT), wherein the photosensitive TFT comprises a first electrode connected to the first terminal, a second electrode connected to the storage circuitry, and a control electrode being grounded.

3. The optical sensing device according to claim 1, wherein the operational amplifier comprises an inverting input terminal connected to the storage circuitry, a non-inverting input terminal connected to a first voltage terminal, and an output terminal connected to an output terminal of the voltage-readout circuitry.

4. The optical sensing device according to claim 3, wherein the output terminal of the voltage-readout circuitry is connected to an external readout device.

5. The optical sensing device according to claim 1, wherein:
the second TFT receives a first signal from the first pulse signal input line to electrically connect the second TFT to the operational amplifier and the storage circuitry, the voltage value of the storage circuitry being amplified and outputted to the output terminal of the voltage-readout circuitry.

6. The optical sensing device according to claim 1, wherein the third TFT receives a second signal from the second pulse signal input line so that the third TFT charges the storage circuitry to the first voltage value through the second TFT.

7. The optical sensing device according to claim 2, wherein the photosensitive TFT is made of a photosensitive material, the photosensitive material including one or more of single-crystal silicon, poly-crystal silicon, amorphous silicon, or oxide.

8. A semiconductor device, comprising the optical sensing device according to claim 1.

9. The semiconductor device according to claim 8, comprising a control circuitry connected to an output terminal of the voltage-readout circuitry, wherein based on the voltage value of the storage circuitry, the control circuitry determines a location and a movement of a touch point on a liquid-crystal display or an organic light-emitting diode display.

10. A method for driving the optical sensing device according to claim 1, comprising:
charging the storage circuitry to the first voltage value;
discharging a leakage current under the light illumination so that electric charges in the storage circuitry drain through the photosensitive circuitry to the first terminal, and the storage circuitry has the second voltage value, a potential of the first terminal being less than a potential of the second terminal;
determining the second voltage value; and
calculating a light intensity of the light illumination based on a difference between a voltage on the first terminal and the second voltage value of the storage circuitry.

11. The method according to claim 10, wherein:
based on the difference between the first voltage value and the voltage of the storage circuitry, the voltage-readout circuitry determines a value of the leakage current and the light intensity of the light illumination at a location of the optical sensing device.

12. The method according to claim 11, wherein a duration for the voltage-readout circuitry to determine the voltage of the storage circuitry and a light intensity of an outside environment is shorter than a duration for the electric charges in the storage circuitry to drain through.

13. An optical sensing device, comprising:
a storage circuitry, a charging circuitry, a photosensitive circuitry including a first terminal and a second terminal, and a voltage-readout circuitry,
wherein:
the photosensitive circuitry is connected to the storage circuitry at the second terminal, and the photosensitive circuitry is connected to the voltage-readout circuitry at the second terminal;
the storage circuitry is being charged during a first time interval and discharged during a second time interval;
during the first time interval, the charging circuitry is switched on and electrically connected to the storage circuitry via the photosensitive circuitry and a thin film transistor (TFT) of the charging circuitry, and the charging circuitry is charging the storage circuitry to a first voltage value, the TFT being switched on during the first time interval;
during the second time interval, the charging circuitry is switched off, and the photosensitive circuitry is discharging the storage circuitry to a second voltage value in response to light illumination and to a potential of the first terminal being less than a potential of the second terminal, the second time interval being after the first time interval; and
during a third time interval, the charging circuitry is switched off, and the voltage-readout circuitry is electrically connected to the storage circuitry, for reading the second voltage value of the storage circuitry with respect to the first voltage value, the third time interval being after the first time interval and the second time interval;
the storage circuitry comprising a capacitor, wherein the capacitor comprises a first terminal being grounded and a second terminal being coupled to the second terminal of the photosensitive circuitry;
the voltage-readout circuitry comprising an operational amplifier;
wherein the voltage-readout circuitry includes a second TFT, wherein the second TFT comprises:
a first electrode connected to the second terminal of the capacitor, a second electrode connected to the inverting input terminal of the operational amplifier, and a control electrode connected to a first pulse signal input line;
wherein the TFT is a fourth TFT and the charging circuitry comprises the fourth TFT, wherein the fourth TFT has a first electrode connected to a second voltage terminal, a second electrode connected to the photosensitive circuitry, and a control electrode connected to a second pulse signal input line.

14. The optical sensing device according to claim 13, wherein the photosensitive circuitry comprises a photosensitive TFT, wherein the photosensitive TFT has a first electrode connected to the second electrode of the fourth TFT, a second electrode connected to the storage circuitry, and a control electrode connected to the second pulse signal input line.

15. The optical sensing device according to claim 14, the photosensitive circuitry further comprising a fifth TFT between the photosensitive TFT and the first terminal, wherein the fifth TFT has a first electrode connected to the first terminal, a second electrode connected to the first electrode of the photosensitive TFT and the second electrode of the fourth TFT, and a control electrode connected to the second pulse signal input line.

16. The optical sensing device according to claim 15, wherein the fourth TFT is N-type transistor, and the fifth TFT is P-type transistor.

* * * * *